(12) United States Patent
Draxelmayr

(10) Patent No.: US 7,911,275 B2
(45) Date of Patent: Mar. 22, 2011

(54) CONSTANT GAIN CONTROL FOR MULTISTAGE AMPLIFIERS

(75) Inventor: Dieter Draxelmayr, Villach (AT)

(73) Assignee: Infineon Technologies AG, Neubiberg (DE)

( * ) Notice: Subject to any disclaimer, the term of this patent is extended or adjusted under 35 U.S.C. 154(b) by 28 days.

(21) Appl. No.: 12/418,634

(22) Filed: Apr. 6, 2009

(65) Prior Publication Data

US 2010/0253430 A1 Oct. 7, 2010

(51) Int. Cl.
*H03F 3/45* (2006.01)

(52) U.S. Cl. ......... 330/254; 330/257; 330/260; 330/310

(58) Field of Classification Search ............... 330/254, 330/257, 260, 310
See application file for complete search history.

(56) References Cited

U.S. PATENT DOCUMENTS

| | | | |
|---|---|---|---|
| 6,215,989 B1* | 4/2001 | Otaka | 455/234.1 |
| 6,369,652 B1* | 4/2002 | Nguyen et al. | 330/253 |
| 6,583,667 B1* | 6/2003 | Dasgupta et al. | 330/254 |
| 7,400,195 B2* | 7/2008 | Gatti | 330/259 |
| 7,417,575 B2* | 8/2008 | Sutardja | 341/161 |
| 7,477,106 B2* | 1/2009 | Van Bezooijen et al. | 330/296 |
| 7,649,418 B2* | 1/2010 | Matsui | 330/284 |

* cited by examiner

*Primary Examiner* — Patricia Nguyen
(74) *Attorney, Agent, or Firm* — SpryIP, LLC

(57) ABSTRACT

This disclosure relates to maintaining constant gain within multi-stage amplifiers.

17 Claims, 5 Drawing Sheets

CONSTANT GAIN CONTROL FOR MULTISTAGE AMPLIFIERS

BACKGROUND

Placing a single amplifier in front of an operational amplifier will increase the gain of the operational amplifier; however the operational amplifier is likely to become unstable as the gain is increased. Operational amplifiers are compensated for a specific gain and phase margin. As gain is increased, phase margin is decreased, which results in poor performance stability of the operational amplifier. Utilizing a multi-stage amplifier (in place of the single amplifier) to increase gain results in similar stability problems.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items.

DETAILED DESCRIPTION

Disclosed herein are techniques for gain control of multistage amplifiers. According to one implementation, a current compensation circuit is coupled to a plurality of amplifier stages. At least one gain control component is located in the current compensation device and within each amplifier stage. The gain control components are configured to control the gain of each amplifier stage. Gain control can be implemented in either an open loop control or closed loop control configuration. A resistive element may be provided in the compensation circuit and may operate to regulate gain within each stage of the multi-stage amplifier in conjunction with other components in each resistive amplifier stage.

According to another implementation, a current compensation device is coupled to a plurality of amplifier stages in a closed loop configuration. The current compensation device contains at least one voltage source, a master amplifier and a differential difference amplifier. Each of the amplifiers in the plurality of amplifiers connected to the current compensation device may be replicas of the master amplifier.

According to another embodiment, a method is provided for operating an amplifier device, such as a closed loop multistage amplifier comprised of a compensation circuit coupled to a plurality of amplifiers. The compensation circuit may comprise a voltage divider, master amplifier, a differential difference amplifier, and at least one gain control component. The voltage divider may provide a first signal and the master amplifier may provide a second signal. The differential difference amplifier compares the first and second signals and, in response, provides a feedback signal. The feedback signal is provided to at least one gain control component in the compensation circuit and at least one gain control component in each of the amplifier stages.

In conventional amplifiers, the gain of the amplifier varies if the supply voltage changes, if the temperature of an associated chip changes, and/or if identically designed chips associated with a given amplifier type originate from different production lots (i.e., process variations). The gain values produced by multistage amplifiers described and illustrated hereby are substantially independent of such voltage, temperature and process variations.

The techniques described herein may be implemented in a number of ways. Examples and context are provided below with reference to the included figures and ongoing discussion.

Exemplary Devices and Methods

Figure 1:
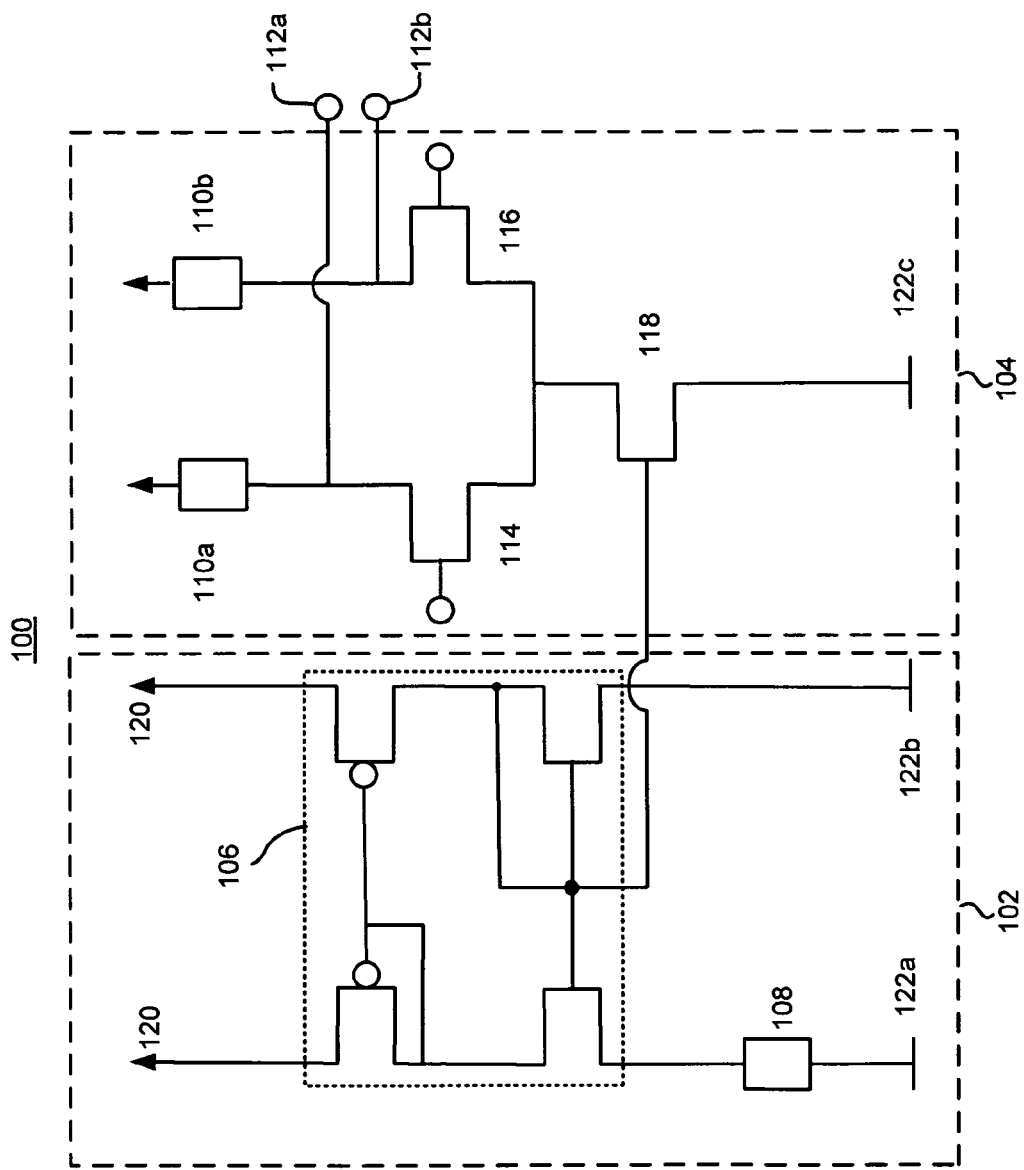
FIG. 1 is a circuit diagram of a single-stage amplifier configured for open loop control.

FIG. 1 depicts a circuit diagram of an open loop single stage amplifier circuit 100 that utilizes a compensation circuit 102 that is coupled to a resistive amplifier 104. The compensation circuit 102 contains a current mirror device 106 that is configured with a resistive gain control component 108, a power supply (as designated by arrows 120), and a ground terminal 122a. The first resistive amplifier 104 contains resistive gain control components 110a and 110b, a pair of transistor components 114 and 116, and a biasing transistor 118 coupled to a ground terminal 122c. Transistors 114 and 116 may be controlled by a voltage signal, such as an input signal to be amplified. The gain for the resistive amplifier 104 is calculated based on the ratio of a characteristic of one or more of the resistive elements (e.g., 110b) in the respective amplifier (e.g., 104) and a characteristic of the resistive element 108 of the compensation circuit 102 along with the gate width/length ratio of the transistors of the amplifier. The characteristic of the resistive elements may be resistance or other suitable feature of the resistive elements.

Figure 2:
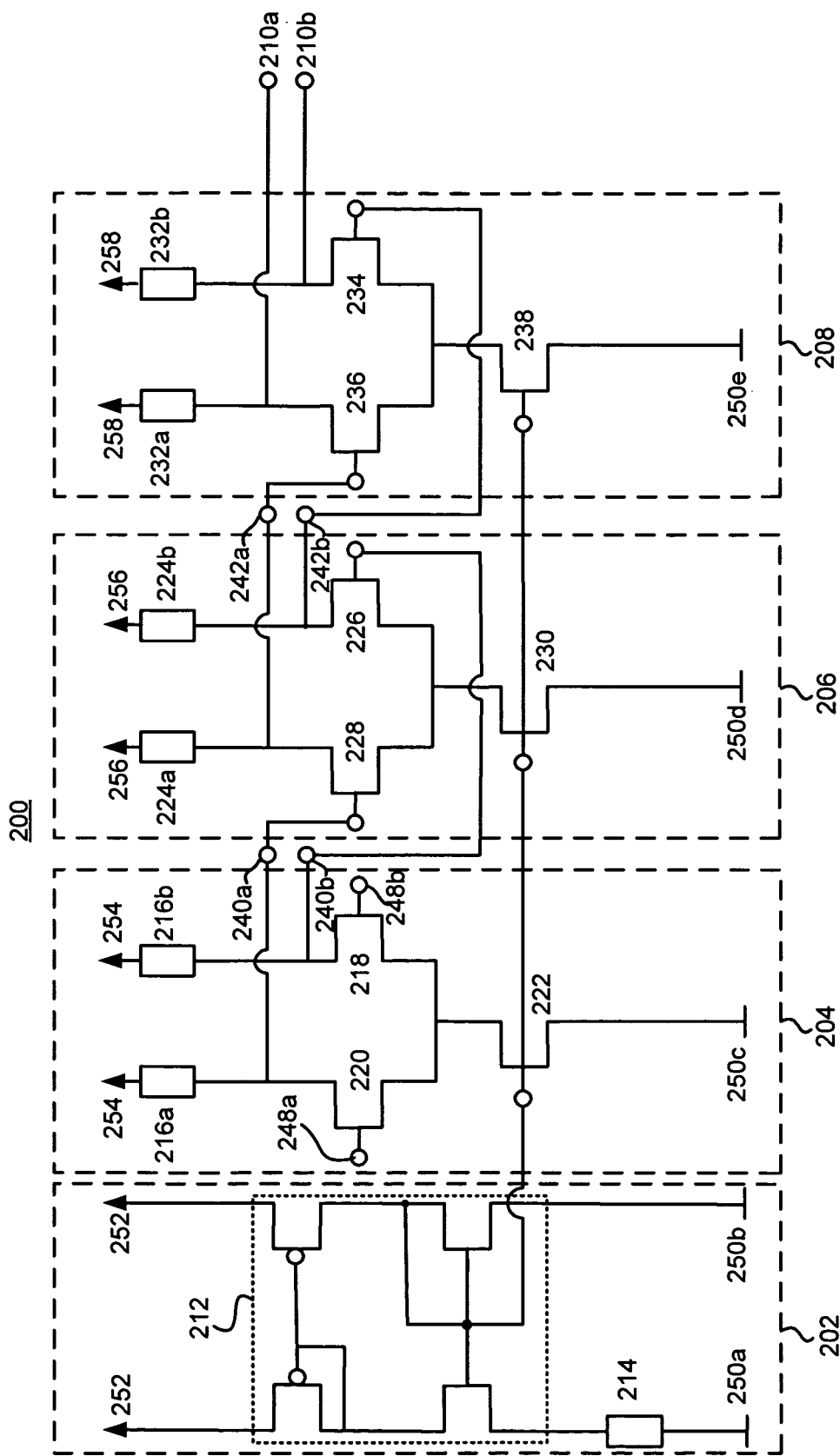
FIG. 2 is a circuit diagram of a multi-stage amplifier configured for open loop control.

FIG. 2 depicts a circuit diagram of an open loop multiple stage amplifier circuit 200 that utilizes a compensation circuit 202 that is coupled to resistive amplifiers 204, 206, and 208. Output terminals 210a and 210b of the multi-stage amplifier circuit 200 provide an output signal of the last resistive amplifier 208. The compensation circuit 202 contains a current mirror 212 that is configured with a resistive gain control component 214 and coupled to ground terminals 250a and 250b. The current mirror may also be connected to a power supply (as designated by arrows 252).

The first resistive amplifier 204 contains resistive gain control components 216a and 216b coupled to a power supply (as designated by arrows 254). According to one example, transistor components 218 and 220, and a biasing transistor 222 coupled to a ground terminal 250c, are all operated to provide output signals to output terminals 240a and 240b.

The second resistive amplifier 206 contains resistive gain control components 224a and 224b coupled to a power supply (as designated by arrows 256). Transistor components 226, 228, and a biasing transistor 230 coupled to a ground terminal 250, which are all operated to provide output signals to terminals 242a and 242b.

The third resistive amplifier 208 contains resistive gain control components 232a and 232b coupled to a power supply (as designated by arrows 258). Transistor components 234, 236, and a biasing transistor 238 coupled to a ground terminal 250, which are all operated to provide output signals to terminals 210a and 210b to provide an output signal for resistive amplifier 208 and the multi-stage amplifier circuit 200.

The use of three resistive amplifiers is only illustrative; alternative embodiments may use a fewer or greater number of resistive amplifiers.

The gain for each resistive amplifier is calculated based on the ratio of a characteristic of the resistive elements (e.g., 216a/216b) in the respective amplifier (e.g., 204) and a characteristic of the resistive element 214 of the compensation circuit 202. The characteristic may be resistance or other suitable feature of the resistive elements. The gain for each amplifier stage may also be calculated based on the ratio of the gate width and gate length of the transistors (e.g., 218, 220, and 222).

Figure 3:
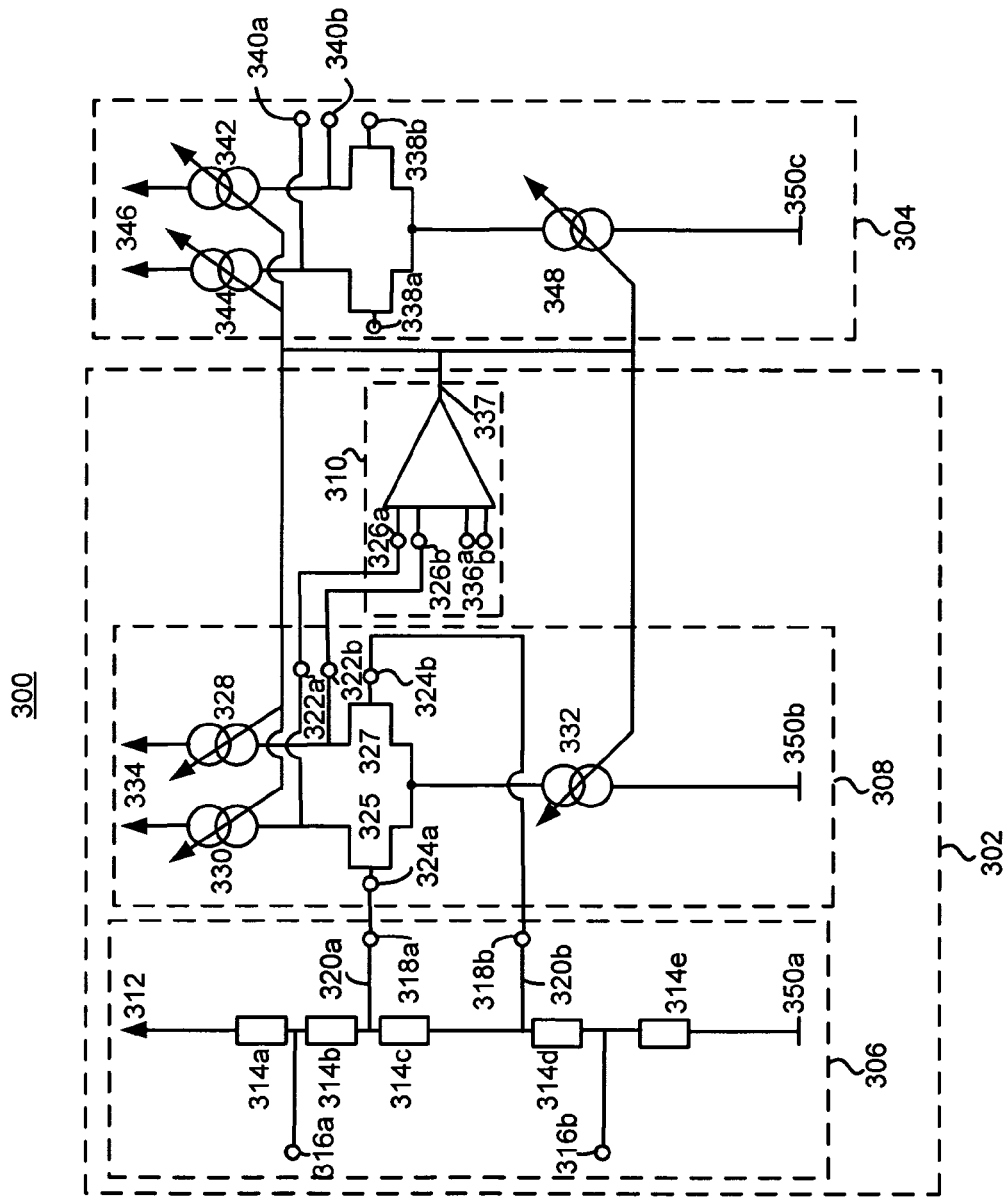
FIG. 3 is a circuit diagram of a single-stage amplifier configured for closed loop control.

FIG. 3 depicts a circuit diagram of a closed loop single stage amplifier circuit 300 that utilizes a compensation circuit 302 that is coupled to an amplifier stage 304. The compensation circuit 302 contains a voltage divider 306, a master amplifier 308, and a differential difference amplifier 310. The voltage divider 306 has a supply voltage terminal 312, which is configured to receive a supply voltage signal. The voltage divider 306 also has one or more resistive elements (e.g., 314a, 314b, 314c, 314d, 314e) and a reference or ground terminal 350a. The voltage divider 306 also has output voltage signal terminals 316a/316b and output voltage signal terminals 318a/318b. However, as those of ordinary skill in the art appreciate, the voltage divider 306 may also be designed to operate capacitively. A voltage divider designed in such a manner would enable the amplifier circuit 300 to be designed without resistors. The use of such capacitively operable voltage dividers applies to all implementations described herein.

The master amplifier 308 has input terminals 324a/324b and output terminals 322a/322b, with current sources 328 and 330 connected to a power supply as designated by arrows 334. The master amplifier input terminals 324a/324b are connected to the output voltage terminals 318a/318b of the voltage divider to control the gates of transistors 325 and 327. The master amplifier 308 also has regulated current sources 328, 330, and 332 configured to receive an output signal along path 337 from the differential difference amplifier 310 in order to maintain constant gain for the master amplifier 308. The master amplifier 308 also has a ground terminal 350b.

The differential difference amplifier 310 has first input terminals 326a/326b to receive the differential voltage signal from the master amplifier output terminals 322a/322b. Second differential input terminals 336a/336b receive a voltage signal from output voltage terminal 316a/316b. The output signal of the differential difference amplifier 310 is provided to the regulated current sources (332, 328, 330) of the master amplifier stage 308. The regulated current sources (332, 328, 330) adjust the current flow of the master amplifier stage 308 such that the voltage signal provided to the first differential input terminal 326a/326b and the voltage signal at the second differential input terminal 336a/336b are approximately equal. The output signal of the differential difference amplifier 310 is also provided to a replica amplifier 304 along path 337. In the illustrated implementation, the regulated current sources (332, 328, 330) are regulated by the differential difference amplifier 310. However, the regulation may also be achieved using common-mode feedback. For example, the differential difference amplifier 310 may regulate one or two of the current sources (i.e., 332, 328, 330), where the remaining one or two of the current sources (i.e., 332, 328, 330) are regulated using common-mode feedback.

The replica amplifier 304 may be configured to be similar or identical to master amplifier stage 308. For example, the replica amplifier 304 has input terminals 338a/338b and output terminals 340a/340b. The replica amplifier also includes current sources 342 and 344 connected to one or more power supplies as indicated by arrows 346 and current source 348. The regulated current sources (342, 344, 348) are configured to receive the signal output from the differential difference amplifier 310 along path 337 to maintain constant gain of the replica amplifier 304. The gain of the replica amplifier 304 may be set equal to the gain of the master amplifier 308. The replica amplifier 304 has a ground terminal 350c.

Generally, it is desirable to determine an AC gain of the closed loop single stage amplifier circuit 300. However, this may be difficult if one or more of the amplifiers associated with the amplifier circuit 300 has some level of DC voltage offset. In particular, it is difficult to accurately determine the AC gain of the amplifier circuit 300 if the master amplifier stage 308 and/or the differential difference amplifier 310 have DC voltage offset. Several techniques may be used to suppress any DC voltage offset associated with the one or more of the amplifiers associated with the amplifier circuit 300. Those techniques include chopping the amplifiers (e.g., amplifier stage 308 and amplifier 310) to suppress the voltage offset, or use switched capacitors associated with the amplifiers to compensate for the offset voltage, and/or a combination of chopping and switched capacitors to compensate for the offset.

Figure 4:
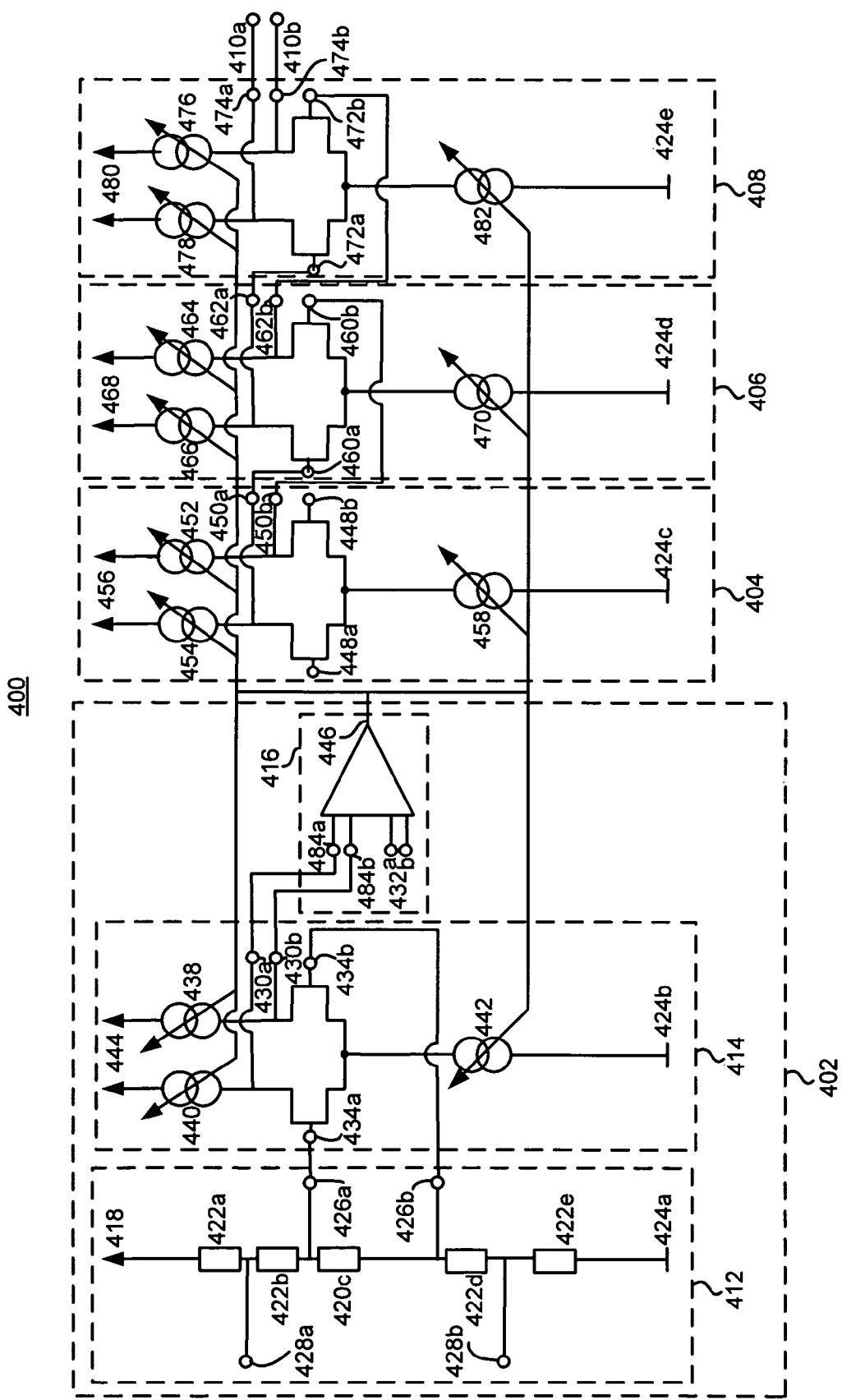
FIG. 4 is a circuit diagram of a multi-stage amplifier configured for closed loop control.

FIG. 4 depicts a circuit diagram of a closed loop multiple stage amplifier circuit 400 that utilizes a compensation circuit 402 that is coupled to three amplifier stages 404, 406, 408, which provide an output signal to output terminals 410a/410b. The compensation circuit 402 contains a voltage divider 412, a master amplifier 414, and a differential difference amplifier 416. The voltage divider 412 is coupled to a supply voltage (as designated by arrow 418), one or more resistive elements (e.g., 422a, 422b, 422c, 422e, and 422d) and a reference or ground terminal 424a. The voltage divider 412 has voltage signal output terminals 426a/426b, and 428a/428b. The master amplifier stage 414 has input terminals 434a/434b and output terminals 430a/430b, with current sources 438 and 440 connected to a power supply (as designated by arrows 444) and a ground terminal 424b. The master amplifier stage 414 also has a regulated current source 442 configured to receive an output signal along path 446 from differential difference amplifier 416. The regulated current source 442 maintains constant gain for the master amplifier stage 414 as a result of a feedback signal provided along path 446 from the differential difference amplifier 416. The differential difference amplifier 416 has a first input terminal 432a/432b connected to the voltage signal output terminal 428a/428b and a second input terminal 484a/484b connected to the master amplifier output terminal 430a/430b. The output signal 446 of the differential difference amplifier 416 is provided to the regulated current sources (438, 440, 442) of the master amplifier stage 414. The regulated current sources (438, 440, 442) adjust the current flow of the master amplifier stage 414 such that the second voltage signal provided along the second input signal path 432a/432b and the voltage signal from the output terminal 436a/436b are approximately equal. The output signal provided along path 446 of differential difference amplifier 416 is also provided to each replica amplifier 404, 406, and 408.

The first replica amplifier 404 may be configured to be similar or identical to master amplifier stage 414. The replica amplifier 404 has input terminals 448a/448b and output terminals 450a/450b with current sources 452 and 454 connected to a power supply (as designated by arrows 456) and a ground terminal 424c. Input terminals 448a/448b are the inputs of the multiple stage amplifier circuit 400 and may be coupled to a device or an arrangement that has a signal for amplification (e.g., a microphone). Replica amplifier 404 also has regulated current sources (452, 454, 458) configured to receive feedback signal 446. The regulated current sources (452, 454, 458) maintain constant gain of the replica amplifier 404. The gain of the replica amplifier 404 is equal to the gain of the master amplifier 414. However, it is also possible to scale the gain of the replica amplifier 404 to achieve, for example, half the gain or twice the gain.

The second replica amplifier 406 may be similar or identical to the first replica amplifier 404. Replica amplifier 406 has input terminals 460a/460b and output terminals 462a/462b with current sources 464 and 466 connected to a power supply (as designated by arrows 468) and a ground terminal 424d. Replica amplifier 406 also has regulated current sources (464, 466, 470) configured to receive a feedback signal along path 446. The regulated current sources (464, 466, 470) maintain constant gain of the replica amplifier 406. The gain of the replica amplifier 406 is equal to the gain of the master amplifier 414. However, it is also possible to scale the gain of the replica amplifier 406 to achieve, for example, half the gain or twice the gain.

The third replica amplifier 408 may be similar or identical to the first replica amplifier 404. Replica amplifier 408 has input terminals 472a/472b and output terminals 474a/474b with current sources 476 and 478 connected to power supply 480 and a ground terminal 424e. Replica amplifier 408 also has regulated current sources (476, 478 482) configured to receive a feedback signal along path 446. The regulated current sources (476, 478, 482) maintain constant gain of the replica amplifier 408. The gain of the replica amplifier 408 is equal to the gain of the master amplifier 414. However, it is also possible to scale the gain of the replica amplifier 408 to achieve, for example, half the gain or twice the gain.

It should be appreciated that the multiple stage amplifier circuits illustrated in FIGS. 1-4 and described herein may be implemented in amplifier arrangements that have one or more conventional amplifier stages that precede or follow the stages of the multiple stage amplifier circuits.

Figure 5:
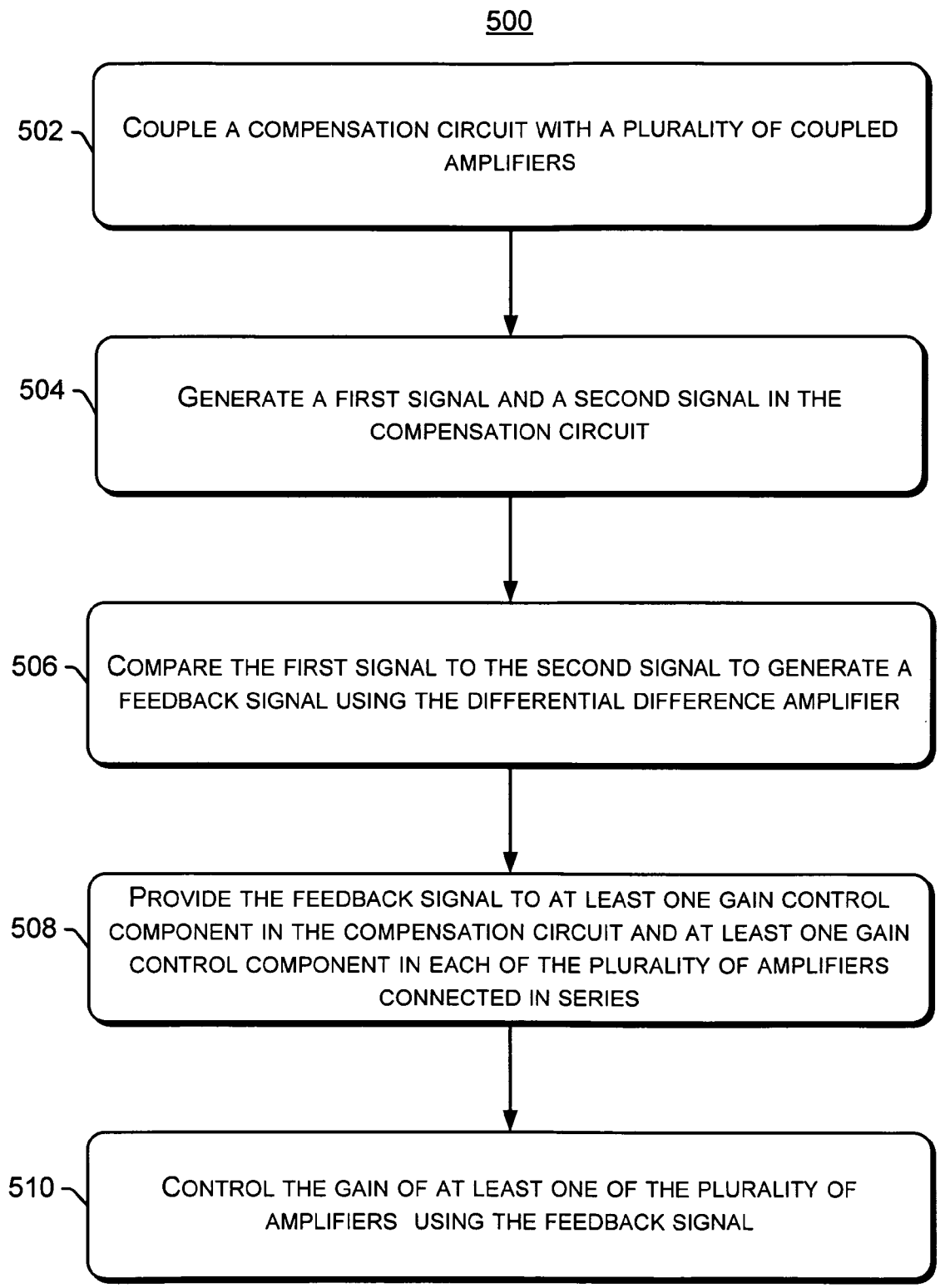
FIG. 5 is a diagram for a method for operating a closed loop multi-stage amplifier device.

FIG. 5 depicts a flow diagram for a method 500, which may be used for operating a multi-stage amplifier device. Specifics of exemplary methods are described below. The process is illustrated as a collection of referenced acts arranged in a logical flow graph, which represent a sequence that can be implemented in hardware, software, or a combination thereof. The order in which the acts are described is not intended to be construed as a limitation, and any number of the described acts can be combined in any order and/or in parallel to implement the process 500.

At 502, a compensation circuit is coupled to a plurality of amplifiers. In one implementation, illustrated in FIG. 4, the gain of the amplifier 404 may be controlled using current sources 452, 454, and 458 that are configured to receive a feedback signal along path 446 from the compensation circuit 402.

At block 504, the compensation circuit generates a first signal and a second signal in the compensation circuit. For example, in an implementation in which the compensation circuit 402 includes at least one voltage source 412, a master amplifier 414, and a differential difference amplifier 416, the first signal may be an output voltage signal from terminal 430a/430b from master amplifier 414 and the second signal may be a voltage signal from terminal 428a/428b from voltage divider 412 coupled to a supply voltage. Alternatively, the first and second signals may be current signals instead of voltage signals.

At block 506, the first signal and the second signal are compared to one another to generate a feedback signal using a differential difference amplifier. In one implementation, the differential difference amplifier 416 compares the first signal provided to terminals 484a/484b and the second signal provided to terminals 432a/432b and generates a feedback signal along path 446.

At block 508, the feedback signal is provided to at least one gain control component in the compensation circuit and at least one gain control component in each of the plurality of amplifiers. For example, the master amplifier 414 contains gain control components 438, 440, and 442; amplifiers 404, 406, and 408 each contain three gain control components (e.g. 452, 454, and 458 for amplifier 404).

At block 510, the gain of the at least one of the plurality of amplifiers is controlled using the feedback signal. For example, the gain of replica amplifier 404 is controlled by current sources 452, 454, and 458. More particularly, current sources 452, 454, and 458 adjust the current flow through the replica amplifier 404 in order to produce a stable gain. Similarly, the gain of replica amplifier 406 is controlled by current sources 464, 466, and 470 and the gain of replica amplifier 408 is controlled by current sources 476, 478, and 482. Additionally or alternatively, the gain of the master amplifier 414 is controlled by current sources 438, 440, and 442.

CONCLUSION

The above described system and methods enable gain control for amplifiers and/or amplifier stages, whether by open loop or closed loop methods. Although the devices and methods have been described in language specific to structural features and/or methodological acts, it is to be understood that the devices and methods defined in the appended claims are not necessarily limited to the specific features or acts described. Rather, the specific features and acts are disclosed as exemplary forms of implementing the claimed devices and methods.

The invention claimed is:

1. An amplifier device comprising:
  a plurality of amplifier stages coupled together, each amplifier stage having at least one gain control component, the at least one gain control component including at least a resistive element and a transistor; and
  a current compensation device connected to an input terminal of a first amplifier stage of the plurality of amplifier stages and having at least one gain control component including at least a resistive element,
  the gain control component of the current compensation device and at least one gain control component of the plurality of amplifier stages configured to control the gain of at least one of the amplifier stages, that gain of at least one of the amplifier stages being determined by the ratio of a characteristic of the resistive element of the current compensation device and a characteristic of the resistive element of at least one of the amplifier stages and at least one characteristic associated with the at least one transistor.

2. An amplifier device according to claim 1, wherein:
  the current compensation device contains a voltage source, a master amplifier, and a differential difference amplifier;
  each of the plurality of amplifiers is a replica of the master amplifier in the current compensation device.

3. An amplifier device according to claim 1, wherein the characteristic of the resistive element of the current compensation device is resistance and the characteristic of the resistive element of at least one of the amplifier stages is resistance.

4. An amplifier device according to claim 2 wherein;
the at least one gain control component of the master amplifier includes at least one current source; and
the voltage source includes a voltage divider.

5. An amplifier device according to claim 2, wherein:
the master amplifier has at least one input terminal, at least one output terminal, and at least one gain control component;
the differential difference amplifier has two or more input terminals and at least one output terminal;
the voltage source is configured to provide a first voltage signal to the first input terminal of the master amplifier and a second voltage signal to the first input terminal of the differential difference amplifier;
the first and second voltage signals are related to each other by a constant value; and
the master amplifier is configured to provide an output voltage signal to the second input of the differential difference amplifier.

6. An amplifier device according to claim 5, wherein:
the replica amplifiers have at least one gain control component; and
the output terminal of the differential difference amplifier is connected to at least one of the gain control components of the master amplifier and at least one of the gain control components of each of the replica amplifiers.

7. An amplifier device according to claim 2, wherein the differential difference amplifier is configured to provide an output signal to the master amplifier to regulate the gain of the master amplifier.

8. An amplifier device according to claim 2, wherein the differential difference amplifier is configured to provide an output signal to each replica amplifier to regulate the gain of each replica amplifier.

9. An amplifier device according to claim 2, wherein the gain control components of the master amplifier comprises at least one current source and at least one transistor and each of the replica amplifiers comprise at least one current source and at least one transistor.

10. An amplifier device according to claim 2, wherein the at least one gain control component of the master amplifier comprises at least one voltage source and at least one transistor and the replica amplifiers each comprise at least one gain control component having at least one voltage source and at least one transistor.

11. An amplifier device according to claim 1, wherein the gain control component of the current compensation device and at least one gain control component of the plurality of amplifier stages are configured to control the gain of a plurality of the amplifier stages.

12. A method comprising:
coupling a compensation circuit to a plurality of amplifiers;
generating a first signal and a second signal in the compensation circuit;
comparing the first signal to the second signal to generate a feedback signal using a differential difference amplifier;
providing the feedback signal to at least one gain control component in the compensation circuit and at least one gain control component in at least one of the plurality of amplifiers; and
controlling the gain of at least one of the plurality of amplifiers using the feedback signal.

13. A method according to claim 12, wherein the first signal is a voltage signal and the second signal is a voltage signal.

14. A method according to claim 12, wherein the first signal is a current signal and the second signal is a current signal.

15. A method according to claim 12, wherein controlling the gain of at least one of the plurality of amplifiers comprises controlling the current flow through at least one of the plurality of amplifiers.

16. A method according to claim 12, wherein the compensation circuit comprises at least one voltage source, a master amplifier, and the differential difference amplifier, the method further comprising controlling the gain of the master amplifier using the feedback signal.

17. A method according to claim 16, wherein the first signal may be an output voltage signal from the master amplifier and the second signal may be a voltage signal from a voltage divider coupled to a supply voltage.

* * * * *